United States Patent [19]

Ichikawa et al.

[11] Patent Number: 4,879,555

[45] Date of Patent: Nov. 7, 1989

[54] ABSOLUTE LINEAR POSITION DETECTION DEVICE

[75] Inventors: Wataru Ichikawa, Tokyo; Yuji Matsuki, Sayama, both of Japan

[73] Assignee: Kabushiki Kaisha SG, Tokyo, Japan

[21] Appl. No.: 893,254

[22] Filed: Aug. 4, 1986

[30] Foreign Application Priority Data

Aug. 9, 1985 [JP] Japan .................................. 60-175145

[51] Int. Cl.⁴ .............................................. H03M 1/22
[52] U.S. Cl. .................................. 341/13; 250/231 SE
[58] Field of Search ............. 340/347 P; 250/231 SE; 318/687, 603, 653, 652; 341/9, 13, 15

[56] References Cited

U.S. PATENT DOCUMENTS

| | | | |
|---|---|---|---|
| 2,905,874 | 9/1959 | Kelling | 340/347 P |
| 3,041,598 | 6/1962 | Betts | 340/347 P |
| 3,171,104 | 2/1965 | Norton | 340/347 P |
| 3,286,252 | 11/1966 | Bose | 340/347 P |
| 3,505,576 | 4/1970 | Burkhart | 318/653 |
| 3,534,361 | 10/1970 | Foley | 340/347 P |
| 4,556,886 | 12/1985 | Shimizu et al. | 340/870.32 |
| 4,572,951 | 2/1986 | Toda et al. | 250/231 SE |
| 4,717,874 | 1/1988 | Ichikawa et al. | 324/208 |

FOREIGN PATENT DOCUMENTS 136718   3/1983   Japan .

*Primary Examiner*—William M. Shoop, Jr.
*Assistant Examiner*—Marc S. Hoff
*Attorney, Agent, or Firm*—Spensley Horn Jubas & Lubitz

[57] ABSTRACT

A first pattern which repeats change in the longitudinal direction with a predetermined pitch and a second pattern which changes in the longitudinal direction with a pitch which is different at least from that of the first pattern; both formed of a predetermined material, are disposed on a surface of a rod section. A detection head section is provided in proximity to the rod section, responds individually to the first pattern and the second pattern, changes its relation of correspondence to the respective patterns in accordance with it linear position with respect to the rod section and produces output signals in accordance with the relation of correspondence to the respective patterns. In accordance with the output signals corresponding to the respective patterns, first and secondd absolute position data of different ranges whose one cycle is constituted of one pitch of the respective patterns can be obtained. By combining these absolute position data, linear position of the detection head section with respect to the rod section can be specified in an absolute value. By disposing the first and second patterns in a mixed state on a single rod section, the construction of the device can be simplified.

18 Claims, 11 Drawing Sheets

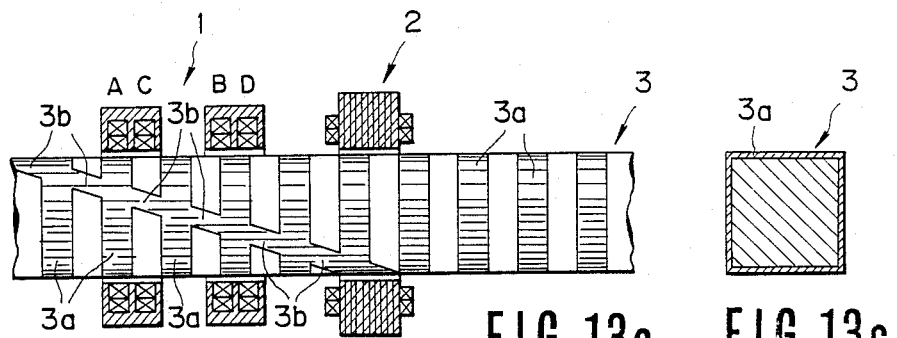
FIG.13a  FIG.13c
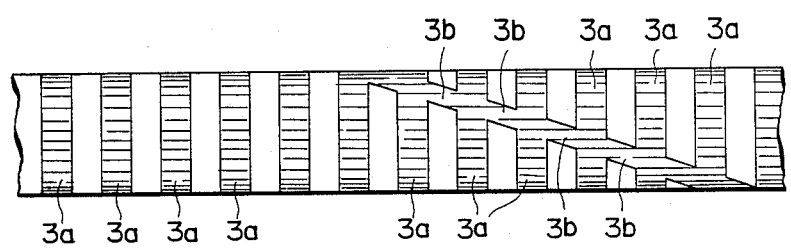
FIG.13b
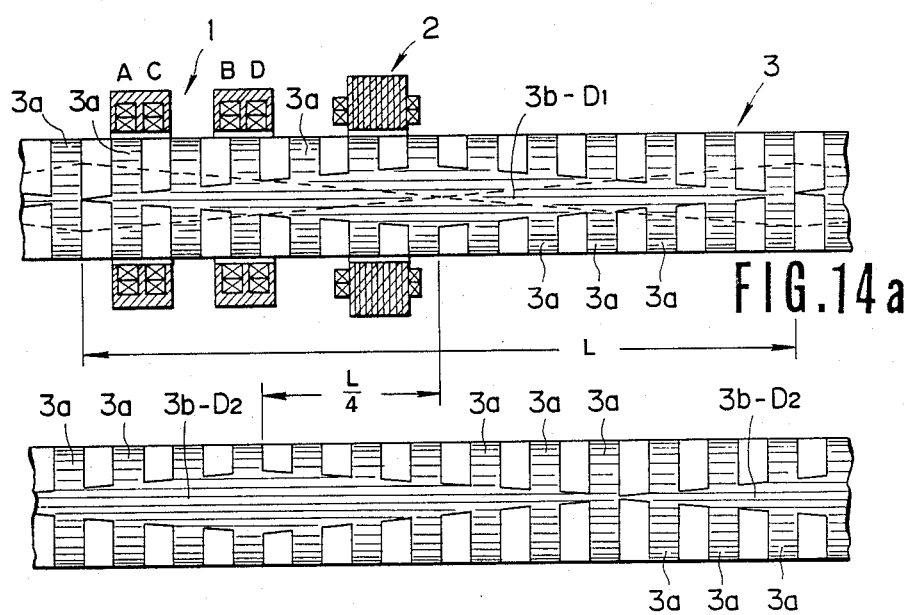
FIG.14a
FIG.14b

ABSOLUTE LINEAR POSITION DETECTION DEVICE

BACKGROUND OF THE INVENTION

This invention relates to an absolute linear position detection device used for a positioning device or the like and, particularly, to a position detection device realizing an enlarged detection range within which a position can be detected in an absolute value with a simplified construction.

Japanese Preliminary Utility Model Publication No. 136718/1983 filed by the applicant of the present application discloses a detection device in which a magnetic substance portion and a non-magnetic substance portion are alternately and repeatedly provided on a rod section in the logitudinal direction thereof, a magnetic type detection head (detection sensor) comprising a primary coil and a secondary coil is provided in proximity to this rod section, the rod section is relatively displaced with respect to the sensor in accordance with mechanical linear displacement which is the object of detection, and an output signal corresponding to absolute position of the rod section relative to the sensor is derived from the sensor. This prior art device, however, has the problem that the range within which the position can be detected in an absolute value is limited to the length of one pitch of repetition of the magnetic substance portion and the non-magnetic portion.

U.S. Pat. No. 4,572,951 (Particularly FIG. 9) discloses a device in which a plurality of rod sections are provided, the pitch of repetition of a magnetic substance portion and a non-magnetic portion is made different from one rod section to another and detection of position over a wide range is realized by processing absolute position detection data concerning respective rod sections.

Although U.S. Pat. No. 4,572,951 can expand the range of detecting an absolute position, it has the problem that it necessitates a complex construction for it requires a plurality of rod sections.

SUMMARY OF THE INVENTION

It is, therefore, an object of the invention to provide an absolute position detection device which is capable of expanding the range within which the absolute position can be detected without providing a plurality of rod sections.

The absolute position detection device according to the invention is characterized in that it comprises a member having a first pattern which repeats change in the longitudinal direction of the member with a predetermined pitch and a second pattern which changes in the longitudinal direction of the member with a pitch which is different at least from that of the first pattern, these patterns being formed of a predetermined material and disposed on the member, and a detection head section provided in proximity to this member and responding individually to the first pattern and the second pattern on said member, said detection head section changing its relation of correspondence to the respective patterns in accordance with its linear position with respect to said member and producing output signals in accordance with the relation of correspondence to the respective patterns.

Since plural patterns of different pitches are both provided on a common member, the structure of this member can be simplified. If, for example, this member is a rod, it is no longer necessary to provide a rod for each pattern since plural patterns can be provided commonly on a single rod and, accordingly, the structure of the rod member can be simplified.

In one embodiment of the invention, the second pattern may consist of a pattern which is of a different form from the first pattern. In this case, the two patterns can be disposed in a mixed state in a common region of the member.

In another embodiment, the second pattern may consist of a pattern which is of substantially the same form as the first pattern. In this case, the respective patterns may be independently disposed along different channels provided on the member.

In one embodiment, the detection head section comprises a plurality of detection heads producing output signals individually in correspondence to the respective patterns. For example, it comprises a first detection head which changes its relation of correspondence to the first pattern in accordance with its positional relation with respect to the member on which the patterns are provided and produces an output signal corresponding to this relation of correspondence and a second detection head which changes its relation of correspondence to the second pattern in accordance with its positional relation with respect to the member and produces an output signal corresponding to this relation of correspondence.

In another embodiment, the detection head section may consist of a detection head which is common to the respective patterns. A plurality of output signals corresponding to the respective patterns may be individually derived from this common detection head. Alternatively, the detection head section may comprise a circuit which electrically processes output signals of this common detection head to provide a plurality of output signals corresponding to the respective patterns.

By providing the first pattern and the second pattern in different forms, or by providing them in different channels, a head output signal responsive substantially to the first pattern only and a head output signal responsive substantially to the second pattern only may be separately obtained. From the head output signal responsive to the first pattern, position data corresponding to the relative positional relation between the member on which the patterns are provided and the detection head section can be obtained as data having periodicity with one pitch of the first pattern constituting one cycle. Likewise, from the head output signal responsive to the second pattern, position data corresponding to the relative positional relation between the member on which the patterns are provided and the detection head section can be obtained as data having periodicity with one pitch of the second pattern constituting one cycle. By combining these position data corresponding to the two patterns, the absolute position can be detected with high accuracy and in an expanded range.

For example, for enabling the first and second patterns of different forms to be distinguished from each other, a magnetic type sensor may be employed as the detection head and a material responding to magnetism may be utilized as the material constituting the patterns. For example, the patterns may be formed of a good conductor such as copper or aluminum. In this case, an eddy current is produced in response to flux in accordance with the relation of correspondence between the patterns and the head and an output signal corresponding to reluctance change responsive to the eddy current loss can be provided by the detection head. Alternatively, the patterns may be formed of magnetic substance such as iron. In this case, reluctance changes in accordance with the relation of correspondence between the patterns and the head and an output signal responsive thereto can be provided by the detection head.

As the magnetic type detection head, one comprising means for generating flux and means for detecting magnetism may be employed. For example, the means for generating flux comprises a primary exciting coil and the means for detecting magnetism comprises a secondary induction coil. The primary coil and the secondary coil may consist of separate coils or may be constructed of a common coil.

For performing the absolute position detection in an expanded range, known in the art are two systems described below. The present invention is applicable to either one of the two systems.

One of the two systems is the vernier system using combination of a main scale and a vernier. According to the vernier system, the combination of one of the patterns and the detection head is used as the main scale whereas the combination of the other pattern and the detection head is used as the vernier. Expansion of the range within which the absolute position can be detected is ensured by the main scale and higher resolution of detection is ensured by the vernier. In the absolute position detection system based on this vernier principle, relation between one pitch length P of the first pattern and one pitch length L of the second pattern is L>>P and one pitch length P of the first pattern is the absolute position detectable range of the vernier and one pitch length L of the second pattern is the absolute position detectable range of the main scale. In this case, the range in which the second pattern is actually disposed need not be the entire one pitch length L but may be a range which is shorter than L but is longer than P or, conversely, exceed one pitch length L. The other system is the absolute position detection system as described in the above mentioned U.S. Pat. No. 4,572,951. In this system, pitch length P1 of the first pattern and pitch length P2 of the second pattern may be made different from each other and the absolute position detection over a range of plural pitches is realized by carrying out the prescribed operation utilizing detection head output signals corresponding to the respective patterns.

Various preferable forms of the first and second patterns can be conceived. For a preferable example, the forms of the respective patterns are determined in relation to the manner of arrangement of the detection heads. By contriving a suitable arrangement of the detection heads, the forms of the respective patterns can be determined in such a manner that the respective detection heads substantially respond only to their corresponding patterns. For example, one of the first and second detection heads is preferably arranged so that it detects the pattern, in a position in which it is disposed, covering the entire region in the lateral direction of a surface on which the pattern is disposed whereas the other detection heads is arranged so that it detects the pattern, in a position in which it is disposed, covering a part of the region in the lateral direction of the surface on which the pattern is disposed, and the patterns corresponding to the respective heads are provided so that they change in the longitudinal direction of the rod section in a form suitable for the regions which the respective heads cover. Various other forms and arrangements can also be adopted.

Embodiments of the invention will now be described in conjuntion with the accompanying drawings.

BRIEF DESCRIPTION OF THE DRAWINGS

In the drawings,

FIG. 13a is a front view of an example of the pattern disposed on a rod section of a square cross section, FIG. 13b is a bottom view thereof and FIG. 13c is a cross sectional view thereof;

FIG. 14a is a front view of another example of the pattern disposed on the rod section of a square cross section and 14b is a bottom view thereof;

FIGS. 16a through 16d show an example of the pattern disposed on an elongated flat member in which FIG. 16a is a plan view, FIG. 16b is a side view, FIG. 16c is a sectional view of the first detection head taken along lines c—c in FIG. 16b and FIG. 16d is a sectional view of the second detection head taken along lines d—d in FIG. 16b;

DESCRIPTION OF PREFERRED EMBODIMENTS

Figure 1:
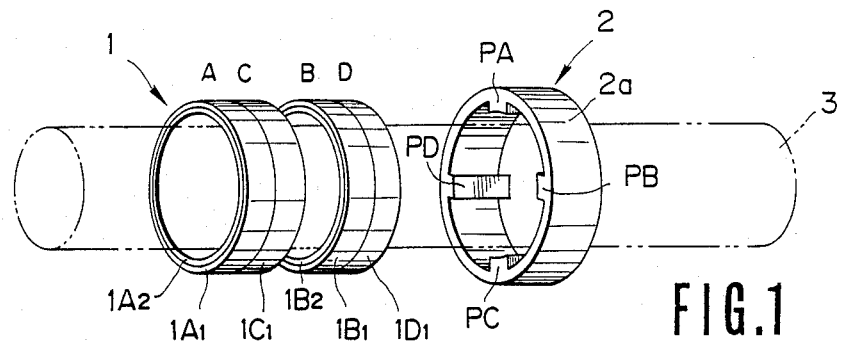
FIG. 1 is a perspective view showing an embodiment of the invention in connection with a detection head section.
Figures 3, 4:
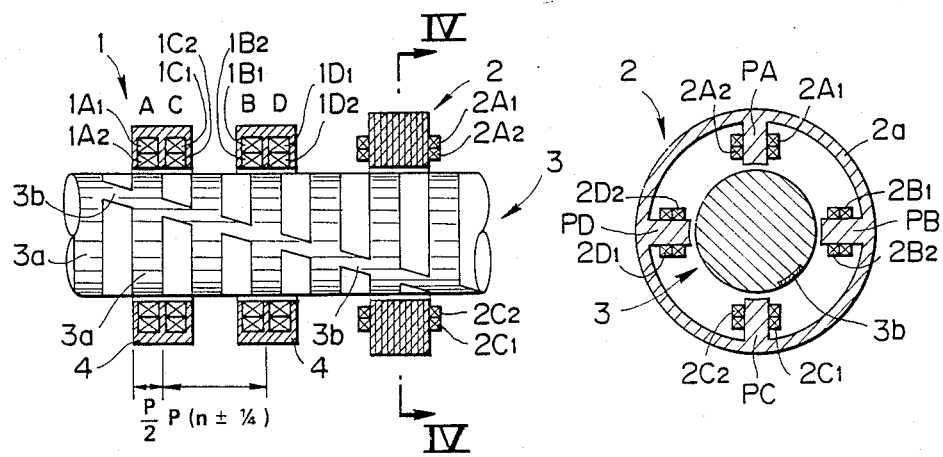
FIG. 3 is a sectional side view showing the detection head section of the same embodiment in a vertical section and the rod section in a side view.
FIG. 4 is a sectional view taken along lines IV—IV in FIG. 3 showing an example of a second detection head.

Referring to FIG. 1, this absolute position detection device comprises first and second detection heads 1 and 2 fixed to each other in predetermined locations and a rod section 3 which is inserted in a space in these detection heads and is displaceable in a longitudinal direction (i.e., axial direction) with respect to these heads. The first detection head 1 includes coils for four phases which are disposed in axially different locations. The rod section 3 is inserted in the space of these coils and flux produced by these coils is directed in the longitudinal direction (axial direction) of the rod section 3. The phases of the coils are distinguished, for the sake of convenience, by using reference characters A, B, C and D. As is best shown in FIG. 3, the coils of the respective phases A through D comprise primary coils $1A_1$ through $1D_1$ and secondary coils $1A_2$ through $1D_2$. The primary coil and secondary coil of the same phase are wound in the same location. Length of each coil is P/2 (P being any number) and the coils of the phase A and phase C are disposed adjacent to each other while the coils of the phase B and phase D are disposed adjacent to each other. The interval between the group of the phases A and C and the group of the phases B and D is "$P(n\pm\frac{1}{4})$" (n being any natural number). Reference character 4 designates a magnetic shield for preventing crosstalking.

The second detection head 2 includes also coils of four phases and flux produced by these coils is directed in a direction crossing the rod section 3 (i.e., radial direction). As is best shown in FIG. 4, the second detection head 2 includes a magnetic substance core 2a provided with four projecting poles PA through PD corresponding to the respective phases which are disposed at an interval of 90 degrees and have inwardly facing ends, and primary coils $2A_1$ through $2D_1$ and secondary coils $2A_2$ through $2D_2$ wound on the respective projecting poles. The rod portion 3 is inserted in a space defined by the end portions of the poles PA through PD.

The first head 1 performs its detection operation in the location in which it is disposed, covering the entire axial range of the rod section 3 whereas the second head 2 performs its detection operation in the location in which it is disposed, covering a part of the rod section 3 (i.e., a portion of the rod portion 3 opposite to the respective poles PA through PD).

Figure 2:
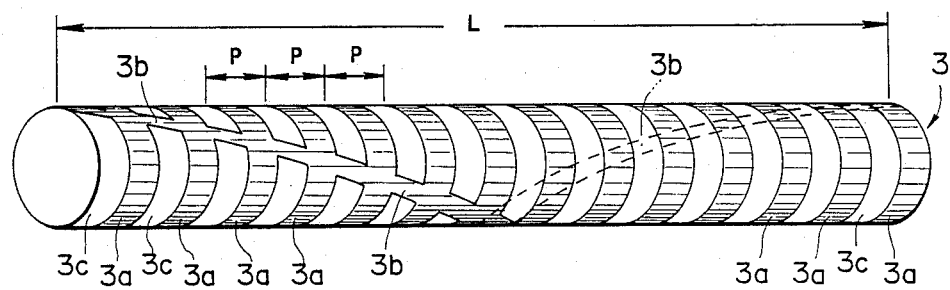
FIG. 2 is a perspective view showing the same embodiment in conncetion with a rod section.

The rod section 3 is provided with two different patterns which are, as best shown in FIG. 2, arranged in a mixed state. The first pattern corresponds to the first head 1 and is adapted to change in the longitudinal direction of the rod section 3 in such a form as to conform to the range of detection of the first head 1. More specifically, the first pattern consists of rings 3a having a width of P/2 and consisting of a material reacting to magnetism which are repeatedly provided in the longitudinal direction with an interval of P/2. The length of one pitch of the rings 3a is P. Thus, the first pattern consisting of the repeatedly provided rings 3a is formed in such a manner that the area of each of the rings 3a facing the coils of respective phases of the first head 1B changes with displacement of the rod section 3.

The second pattern corresponds to the second head 2 and is adapted to change in the longitudinal direction of the rod section 3 in such a form as to conform to the range of detection of the second head 2. More specifically, the second pattern is formed of a strip 3b having a predetermined width and consisting of a material reacting to magnetism which is provided spirally along the rod section 3. The relation of correspondence between the respective poles PA through PD and the spiral strip 3b changes with displacement of the rod section 3 and an output signal corresponding to the relation of correspondence is derived from the head 2. On the other hand, the relation of correspondence between the respective poles PA through PD of the second head 2 and the rings 3a of the first pattern does not undergo substantial change with displacement of the rod section 3. The relation of correspondence between the coils of the respective phases of the first head 1 and the rings 3a of the first pattern changes with displacement of the rod section 3 as described above and an output signal corresponding to the relation of the correspondence is derived from the head 1. On the other hand, the relation of correspondence between the coils of the respective phases of the first head 1 and the strip 3b of the second pattern does not undergo substantial change with displacement of the rod section 3. Accordingly, despite existence of the patterns 3a, 3b of different forms on the single rod section 3, the first head substantially responds only to the ring 3a constituting the first pattern to produce a position detection output signal whereas the second head 2 responds only to the spiral strip 3b constituting the second pattern to produce a position detection output signal. One pitch of the spiral strip 3b of the second pattern is designated by a reference character L which is set to be L>>P.

The material constituting the patterns of the rod section 3 is one which causes reluctance change to be varied depending upon extent of entering of this material in the magnetic field of the detection heads. For such material, a material which is a better conductor than other portion 3c of the rod section 3 or magnetic substance can preferably be employed.

Let us assume that the patterns 3a and 3b of the rod section 3 are constructed of a good conductor such as copper and the other portion 3c of a material which is less conductive than this good conductor (e.g., iron). Flux of each of the primary coils $1A_1$ through $1D_1$ of the respective phases of the first head 1 is produced in the axial direction of the rod section 3 with the range equivalent to the coil length P/2 of the respective coils. As the rod section 3 displaces in the axial direction and rings 3a of the first pattern enter the magnetic fields of the respective coils of the head 1 in accordance with the amount of displacement, an eddy current flows through the rings 3a which consist of a good conductor in accordance with the extent of entering of the rings 3a into the coils. The larger the extent of entering of the ring 3a (e.g., a state in which the ring 3a corresponds to the coils $1A_1$, $1A_2$ in FIG. 3 at the maximum), the larger is the eddy current flowing through this ring 3. Conversely, in a state in which the ring 3a has not entered the coil at all (e.g., a state in which the ring 3a corresponds to the coils $1C_1$, $1C_2$ in FIG. 3), little eddy current flows. Thus, the eddy current flows in accordance with the extent of entering of the good conductor rings 3a of the rod section 3 into the coils of the respective phases of the first head 1 and the reluctance change due to an eddy current loss caused by this eddy current is produced in magnetic circuits of the coils of the respective phases. AC signals each having a peak level corresponding to this reluctance change are induced in the secondary coils $1A_2$ through $1D_2$ of the respective phases. The reluctance changes of the respective phases are different by 90 degrees from each adjacent phase due to difference of location of the respective coils $1A_1$ through $1D_2$. If, for example, the phase A is a cosine phase, the phase B is a sine phase, the phase C is a minus cosine phase and the phase D is a minus sine phase. One cycle of the reluctance change corresponds to one pitch P of the repeated pattern of the rings 3a.

In accordance with the magnitude of this reluctance, a relative position of the rod section 3 with respect to the first head 1 can be detected in an absolute value within the range of one pitch length P of the first pattern. Describing the case in which this detection is made by a phase system, the primary coils $1A_1$ of the phase A and $1C_1$ of the phase C are excited by a sine signal sin ωt and the primary coils $1B_1$ of the phase B and $1D_1$ of the phase D are excited by a cosine signal cos ωt. Then, as a detection head output signal Y1 which is a combined signal of induced voltages of the respective secondary coils $1A_2$ through $1D_2$, an AC signal $$Y1 = K \sin(\omega t + \phi) \quad (1)$$

can be obtained. In this equation, φ represents a phase angle corresponding to a position x of the rod section 3 within the range of one pitch length of the first pattern and can be set at a relation φ=2 πP/x. K is a constant determined depending upon various conditions. In this manner, the amount of phase shift φ of the first detection head output signal Y1 with respect to a reference AC signal sin ωt represents a linear position x of the rod section 3 within one pitch length P of the first pattern. This phase shift amount φ can be measured in a digital or analog manner by employing a suitable measuring means.

The spiral strip 3b constituting the second pattern does not respond to the first head 1 with respect to displacement of the rod section 3. In other words, wherever the rod section 3 is positioned, the eddy current loss due to the strip 3b affects the first head always to substantially the same degree. Accordingly, the influence of the spiral strip 3b constituting the second pattern does not appear in the output signal Y1 of the first head 1 at all but the influence of the first pattern only appears.

On the other hand, flux by each of the primary coils $2A_1$ through $2D_1$ of the respective phases of the second head 2 is produced in the radial direction of the rod section 3 in angular positions in which the poles PA through PD of the respective phases are disposed. Within the range of one pitch length L of the spiral strip 3b constituting the second pattern, the position of the spiral strip 3b with respect to the poles PA through PD of the head 2 varies with the linear position of the rod section 3 with respect to the head 2. When the flux penetrates a part of the strip 3b, an eddy current flows through that part with a result that reluctance change corresponding thereto occurs in the magnetic circuit through which the flux flows. Accordingly, the reluctance in the respective poles PA through PD of the head 2 changes with the one pitch length L of the strip 3b constituting one cycle and the phase of the reluctance change is different by the distance of L/4 between adjacent poles. Accordingly, in the same manner as in the above described head 1, if the reluctance change in the pole PA corresponding to the phase A is a cosine phase, the one in the pole PB corresponding to the phase B is a sine phase, the one corresponding to the phase C is a minus cosine phase and the one in the phase D corresponding to the phase D is a minus cosine phase.

In accordance with the magnitude of this reluctance change, the position of the rod section 3 corresponding to the second head 2 can be detected in an absolute value within the range of one pitch length L of the second pattern. In the case where this detection is performed by a phase system, the primary coils $2A_1$ and $2C_1$ of the phases A and C are excited by the sine signal sin ωt and the primary coils $2B_1$ and $2D_1$ of the phases B and D are excited by the cosine signal cos ωt in the same manner as was previously described. Then, as a detection head output signal Y2 which is a combined signal of induced voltages in the secondary coils $2A_2$ through $2D_2$, an AC signal $$Y2 = K \sin(\omega t + \alpha) \quad (2)$$

can be obtained. α is a phase angle corresponding to the position X of the rod section 3 within one pitch length L of the second pattern and can be set at a relation $\alpha = 2\pi L/X$. Thus, the phase shift amount α of the second head output signal Y2 with respect to the reference AC signal sin ωt represents the linear position X of the rod section 3 within the range of one pitch length L of the second pattern. This phase shift amount α can also be measured in a digital or analog manner by employing a suitable measuring means.

The rings 3a constituting the first pattern can be arranged so as not to respond to the second head 2 with respect to displacement of the rod section 3. Since the respective poles PA through PD of the second head 2 are disposed on the same circumference and the rings 3a also are disposed on the same circumference, reluctance is the same through all of the poles PA through PD and no difference is produced between these poles. Accordingly, the second head 2 is not substantially affected by the first pattern. In this case, as shown in FIG. 3, the thickness of the poles of the second head 2 should preferably be P.

Figure 5:
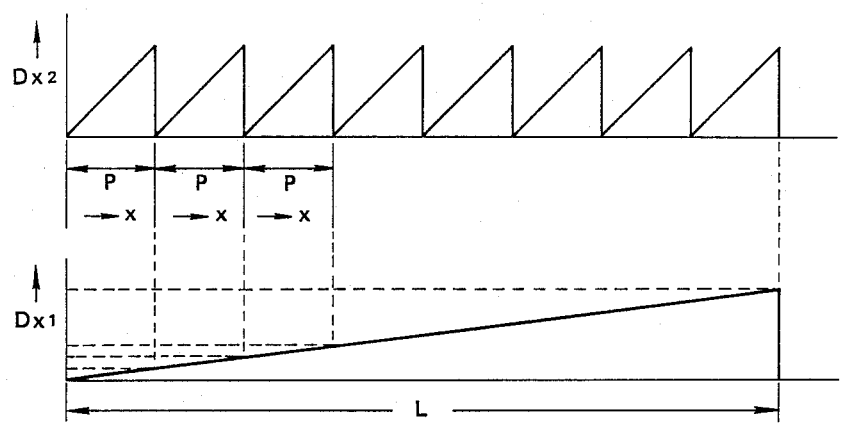
FIG. 5 is a graph showing an example of position detection data obtained from outputs of the first detection head and second detection head in the same embodiment.

As described above, the first head 1 and the second head 2 do not substantially interfere with each other but substantially respond only to the pattern 3a or 3b which corresponds to themselves to produce the output signals Y1 and Y2. Examples of position detection data Dx1 derived from the first head output signal Y1 and position detection data Dx2 derived from the second head output signal Y2 are shown in FIG. 5. The first position detection data Dx1 represents an absolute position within the relatively short distance P. The data Dx1 corresponds to vernier measured data in the vernier principle and is capable of accurate position detection with a high resolution. The second position detection data Dx2 represents an absolute position within the relatively long distance L. The data Dx2 may be data of a rough resolution because accuracy of detection within the distance P can be expected from the first position detection data Dx1. In other words, the second position detection data Dx2 may be of a rough resolution of such a degree as to be able to obtain an absolute value with a minimum unit of L/P. This data corresponds to mainscale measured data in the vernier principle. By combination of the first and second position detection data Dx1 and Dx2, absolute position detection data of a high resolution based on the vernier principle can be obtained over a wide range.

Figure 6:
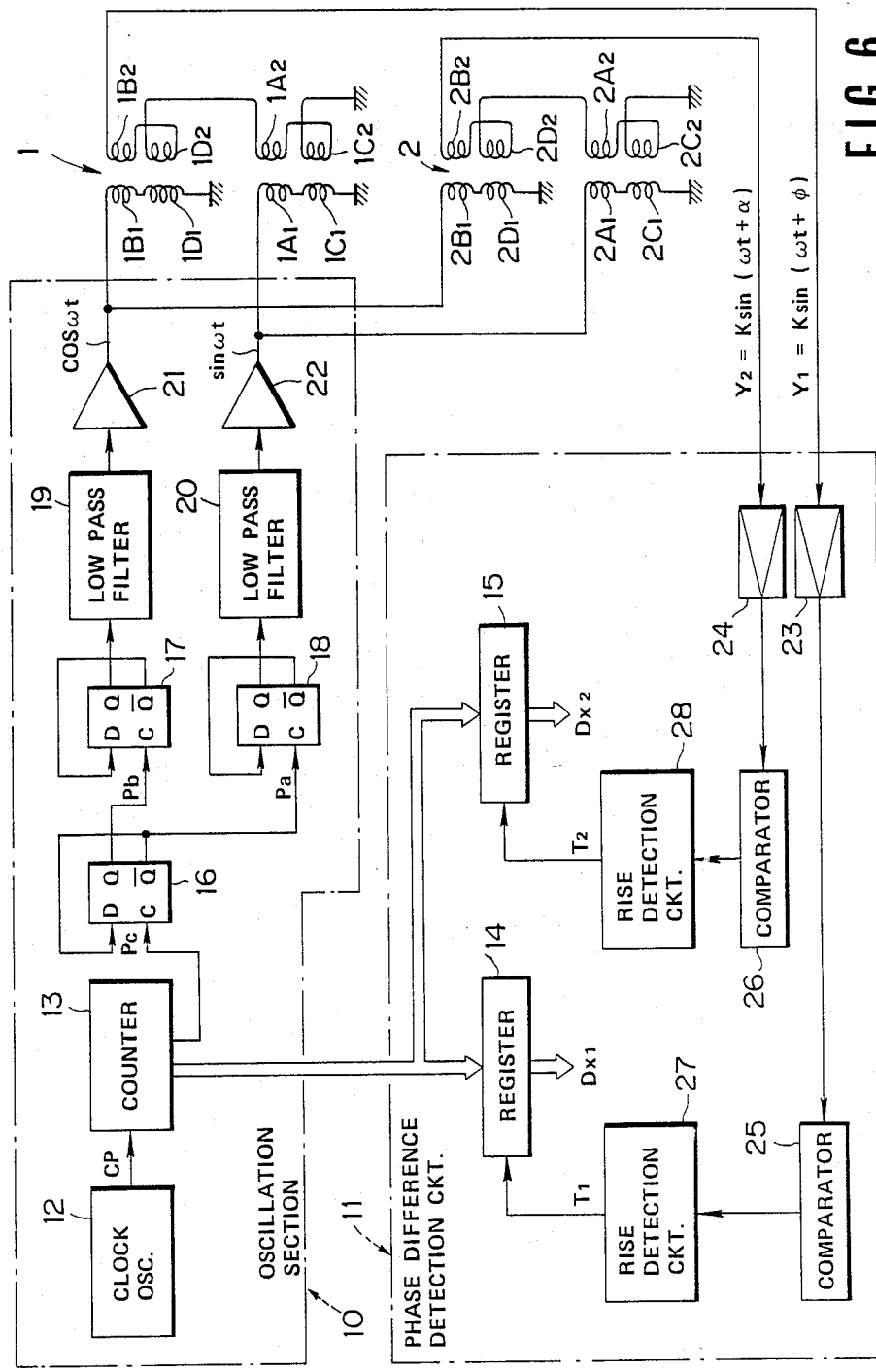
FIG. 6 is an electrical block diagram showing an example each of a circuit for supplying an exciting AC signal to the detection head section and a circuit for detecting an electrical phase of the output signal of the detection head section to obtain the position detection data.

An example of an electrical circuit for producing the detection head output signals Y1 and Y2 in accordance with the above described phase system and measuring the phase shift amounts φ and α in these output signals is shown in FIG. 6.

In FIG. 6, an oscillator section 10 is a circuit for generating the reference sine signal sin ωt and cosine signal cos ωt and a phase difference detection circuit 11 is a circuit for measuring the phase shift amounts φ and α. A clock pulse CP generated by a clock oscillator 12 is counted by a counter 13. The counter 13 is of a suitable modulo M (M being any integer) and its count value is supplied to registers 14 and 15. From a 4/M frequency divided output of the counter 13 is taken out a pulse Pc which is a 4/M frequency divided signal of the clock pulse CP and supplied to a C input of a flip-flop 16 which functions as a two divider. A pulse Pb provided from a Q output of the flip-flop 16 is applied to a flip-flop 17 and a pulse Pa provided from a $\overline{Q}$ output of the flip-flop 16 is applied to a flip-flop 18. Outputs of these flip-flops 17 and 18 are supplied to low-pass filters 19 and 20 and a cosine signal cos ωt and a sine signal sin ωt are derived from these outputs through amplifiers 21 and 22 and applied to the primary coils $1A_1$ through $1D_1$ and $2A_1$ through $2D_1$ for the respective phases A through D of the first and second heads 1 and 2. M count in the counter 13 corresponds to a phase angle of $2\pi$ radian of these reference signals cos ωt and sin ωt. That is to say, one count of the counter 13 represents $2\pi/M$ radian.

The composite outputs signals Y1 and Y2 of the secondary coils 1A₂ through 1D₂ and 2A₂ through 2D₂ are applied to comparators 25 and 26 through amplifiers 23 and 24 and square wave signals corresponding to positive and negative polarities of the signals Y1 and Y2 are respectively provided by the comparators 25 and 26. In response to rising of the output signals of these comparators 25 and 26, pulses T1 and T2 are produced by rise detection circuits 27 and 28. In response to these pulses T1 and T2, the count of the counter 13 is loaded in the registers 14 and 15. As a result, the digital value Dx1 corresponding to the phase shift $\phi$ in the first head output signal Y1 is loaded in the register 14 and the digital value Dx2 corresponding to the phase shift $\alpha$ in the second head output signal Y2 is loaded in the register 15. In this manner, the data Dx1 representing a linear position within the predetermined range P in an absolute value and the data Dx2 representing a linear position within the longer range L in an absolute value can be obtained.

Information which is essentially required in the data Dx2 is one representing the cycle number of the current data Dx1 in the range L. If, for example, the number of repeating cycle of the data Dx1 in the range L is N, result of dividing the value of the data Dx2 by N is the cycle number of the current data Dx1. Accordingly, by combining the value obtained by dividing the data Dx2 by N and the data Dx1, an absolute position over the entire length L can be accurately detected with a high resolution. If $N=2^n$, no particular division is required but more significant n bits of the data Dx2 and the data Dx1 may be combined.

In the foregoing description, it is assumed that the relation between one pitch length P of the first pattern and one pitch length L of the second pattern is $L>>P$. The difference between P and L may however be only a slight one. In that case, a suitable operation is performed employing data Dx1 and Dx2 (e.g., an operation formula described in the above mentioned U.S. Pat. No. 4,572,951 may be employed) and an accurate absolute value can be obtained over the range L in accordance with this operation.

Figure 7:
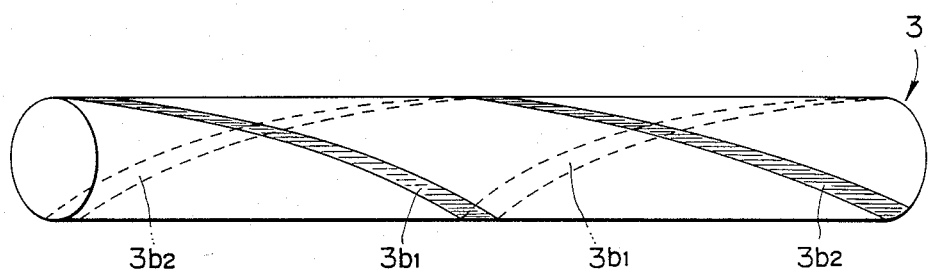
FIG. 7 is a perspective view showing, as another example of the second pattern disposed on the rod section, a double threaded screw type pattern of a spiral strip.
Figure 8:
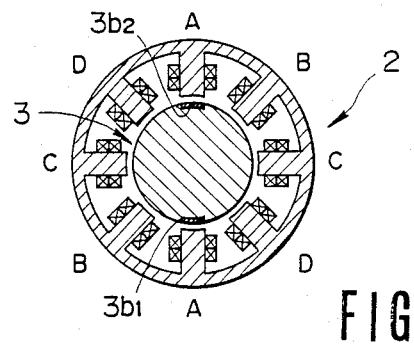
FIG. 8 is a cross sectional view of an eight pole type head which is another example of the second detection head used for detecting the pattern of FIG. 7.

The configuration of the first pattern or the second pattern disposed on the rod section 3 is not limited to the above described one but any suitable configuration may be utilized. For example, the second pattern may be formed by two strips 3b1 and 3b2 in the form of a double-threaded screw as shown in FIG. 7. In this case, the strips 3b1 and 3b2 are disposed in diametrically opposed positions as viewed in the cross section of the rod section 3 so that the second detection head should preferably consist of an eight-pole type core as shown in FIG. 8. The eight-pole type core includes a pair of poles for each of the phases A, B, C and D and poles for the same phase are disposed in diametrically opposed positions. In the same manner as was previously described, primary and secondary coils are wound about each pole and, if detection is made by the phase system, the A and C phases and the B and D phases are excited by AC signals which are different in phase by 90 degrees (e.g., a sine signal and a cosine signal). In this case, since the same phase occupies diametrically opposed positions, no error is produced even if the center of the head 2 is offset slightly from the center of the rod section 3. For convenience in illustration, the rings 3a of the first pattern are not illustrated in FIG. 7 but these rings 3a are of course provided on the rod section 3 as shown in FIG. 2.

Figure 9:
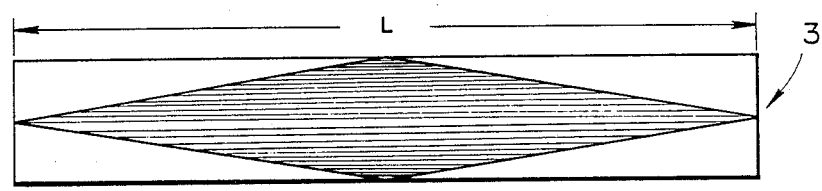
FIG. 9 is a side view showing still another example of the second pattern disposed on the rod section.

Alternatively, a pattern consisting of repeatedly provided spiral strips each having a short pitch length P may be provided and a pattern of a long pitch length L may be provided in a suitable different configuration. For example, the pattern of the pitch length L may be one in which, as shown in FIG. 9, the area of conductive substance (or magnetic substance) gradually increases and decreases. In this case, the pattern of the spiral strips with the short pitch is detected by a detection head which is adapted to form flux on a part of circumference of the rod section 3 and the pattern of the long pitch is detected by a detection head which is adapted to form flux on the entire circumference of the rod section 3. For convenience of illustration, the pattern of the short pitch P is omitted in FIG. 9.

The pattern of the long pitch L is not limited to one pitch only but may be provided over a longer range.

The number of the detection heads and patterns corresponding thereto is not limited to two but the third, fourth etc. detection heads and patterns may be further provided. By this arrangement, the range within which detection of position can be made in an absolute value can be further expanded.

Figure 10:
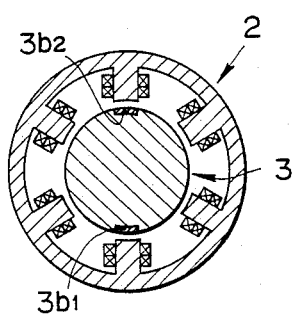
FIG. 10 is a cross sectional view of a six pole type head which is another example of the detection head.

The detection head 2 which forms the flux in the radial direction of the rod section 3 is not limited to the above described four-pole type or eight-pole type one but a detection head of other pole type such as a three-pole type, six-pole type or twelve-pole type may also be employed. By way of example, a head 2 of a six-pole type is shown in FIG. 10. In this example, the primary coil exciting AC signals used for the phase system detection are not signals such as a sine signal and a cosine signal which are out of phase by 90 degrees but AC signals such as sin $\omega t$ on one hand and sin $(\omega\text{-}60)$ or sin $(\omega t - 120)$ or sin $(\omega t - 240)$ on the other, which are out of phase by 60 degrees or its multiples or AC signals which are out of phase by a suitable phase angle. In this case, the pattern corresponding to this may consist of the single threaded screw type strip 3b as shown in FIG. 2 if there are no poles of the same phase in diametrically opposed positions and the pattern may consist also of the double threaded screw type strips 3b1 and 3b2 as shown in FIG. 7 if there are poles of the same phase in diametrically opposed positions. In FIG. 10, a pattern of double threaded screw type spiral strips 3b1 and 3b2 is provided.

The head 1 which forms the flux in the axial direction of the rod section 3 is not limited to the four phase type as described above but may consist of two phases, three phases or other number of phases.

Figure 11:
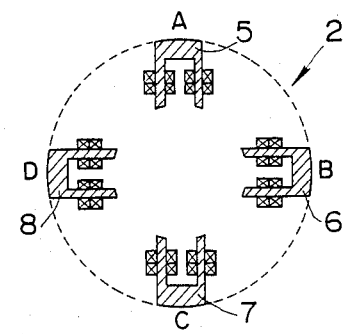
FIG. 11 is a cross sectional view of still another example of the detection head having cores separated for respective poles.

The detection head which forms the flux in the radial direction of the rod section 3 is not limited to the one in which the respective poles are continuously formed with a common core material as shown in FIGS. 4, and 10 but may be one which consists of U-shaped cores 5, 6, 7 and 8 which are separated for the respective poles as shown in FIG. 11. Each of the cores 5 through has two end portions and a flux coming out of one end portion and entering the other end portion passes in the radial direction on the surface of the rod section 3 (at least on the surface on which the pattern is disposed).

Figure 12:
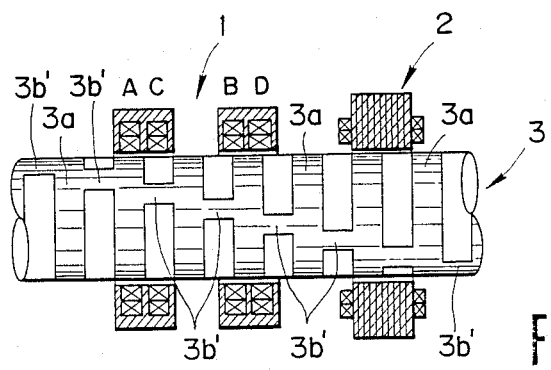
FIG. 12 is a side view showing another example of the spiral pattern disposed on the rod section, the pattern exhibiting a stepwise change.

The spiral pattern need not consist of a smooth spiral strip such as strips 3b, 3b1 and 3b2 but may consist of a stepwisely disposed pattern 3b' as shown in FIG. 12. In short, it will suffice if the pattern exhibits change which more or less resembles a spiral.

Figure 15:
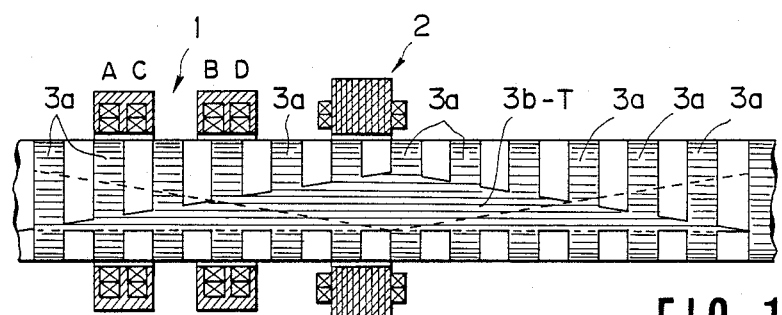
FIG. 15 is a front view showing still another example of the pattern disposed on the rod section of a square cross section.

In the above examples, the rod section 3 on which the patterns are provided is made of a circular rod but it may be made of a square rod or a rod of other configuration. FIG. 13 shows an example in which the rod section 3 is made of a square rod. FIG. 13(a) is a front view, FIG. 13(b) is a bottom view and FIG. 13(c) is a cross sectional view. In the same manner as in the case of the circular rod, the first and second patterns may be provided. For example, the first pattern consists of repeatedly provided square rings 3a and the second pattern consists of a single strip 3b obliquely (i.e., spirally) disposed around the square rod. FIG. 14 shows another example of the second pattern in a square rod section 3 of a square cross section in which FIG. 14(a) is a front view and FIG. 14(b) is a bottom view. In this example, the second pattern consists of rhombic portions 3b-D1, 3b-D2 disposed on respective four sides of the square rod section 3. The positions of the rhombic portions 3b-D1, 3b-D2 of adjacent sides are different by ¼ of one pitch length L of the pattern. The shape of the second pattern in the square rod section 3 may also be a triangle 3b-T as shown in FIG. 15. The rhombic or triangle second pattern as shown in FIG. 14 or FIG. 15 may be used also for the circular rod section 3. In the examples of FIGS. 13 through 15, the same detection heads 1 and 2 as used in the example of FIG. 1 may be used for detecting the pattern (though their overall configuration may be square in conformity with the square cross section of the rod section 3).

Figure 16:
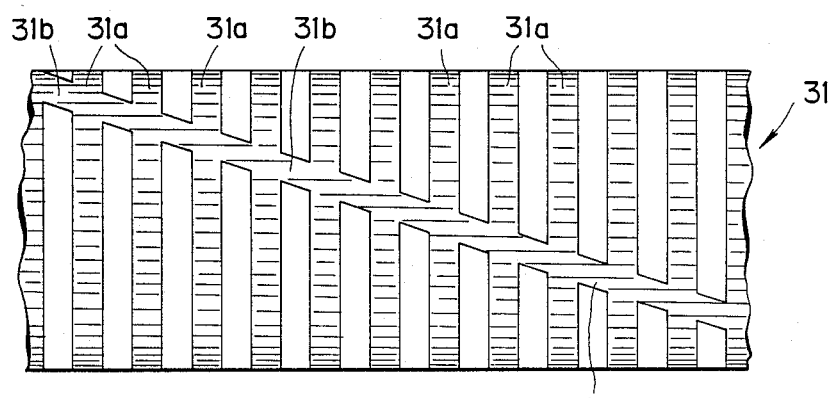
Figure 16:
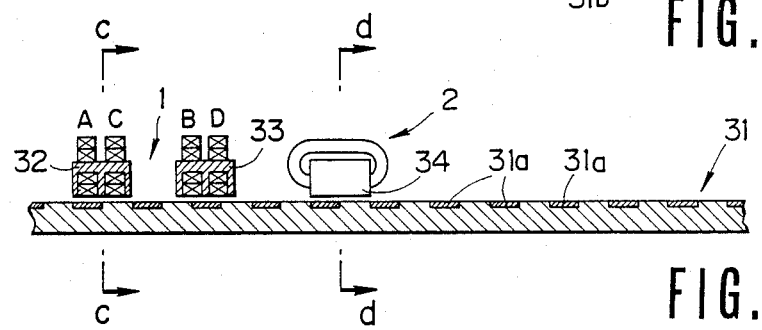
Figure 16:
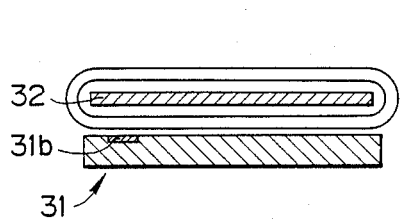
Figure 16:
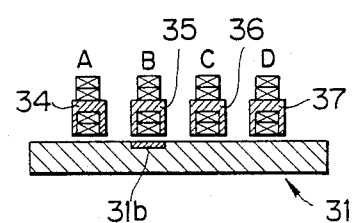

A material on which the patterns are provided is not limited to a rod but it may be made of a flat bar or it may be a flat or curved plane portion of any member. FIG. 16 shows an example in which the patterns are disposed on an elongated flat bar member 31. FIG. 16(a) is a plan view of the flat member 31 and FIG. 16(b) is a side sectional view of the flat member 31 and a detection head provided adjacent to the flat member 31. The patterns provided on the flat member 31 are of shapes obtained by developing the first and second patterns of the rod section 3 shown in FIG. 2. The first pattern is formed by repeatedly providing materials 31a in the longitudinal direction with an interval P/2, which materials 31a extending laterally with a width of P/2. The second pattern consists of a single strip 31b which extends obliquely in the direction of displacement (i.e., longitudinal direction). A first detection head 1 which responds to the first pattern 31a consists of coils of four phases (each phase including primary and secondary coils), the coils of the phases A and C being wound about a magnetic substance core 32 of an E-shaped cross section and the coils of the phases B and D being wound about a magnetic substance core 33 of a likewise E-shaped cross section. Positional relation of the coils of the respective phases A through D is the same as in the example of FIG. 3. In order to cover the entire lateral range of the material 31, the lateral widths of the magnetic substance cores 32 and 33 and the coils correspond to the lateral width of the member 31 as shwon in FIG. 16(c). A second detection head 2 which responds to the second pattern 31b consists of four separated magnetic substance cores 34 through 37 corresponding to the four phases A through D and primary and secondary coils wound about the respective cores. As shown in FIG. 16(d), the cores 34 through 37 of the respective phases are disposed with a predetermined interval (this interval corresponds to the interval of 90 degrees of the poles PA through PD in FIG. 4) in the lateral direction of the flat member 31.

Figure 17:
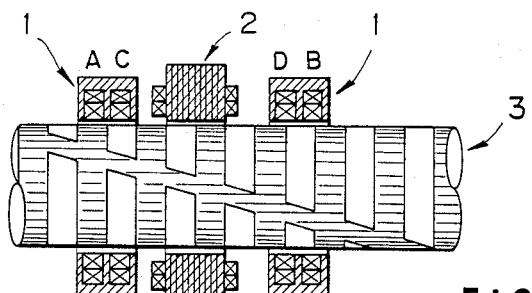
FIG. 17 is a vertical sectional view showing an example in which the first detection head is divided and the second detection head is disposed therebetween.

In constructing one detection head with coils of plural phases as in the above described embodiments, coils of the respective phases need not be disposed close to each other but they may be disposed in a spaced away relation. FIG. 17 shows an example of such spaced away arrangement. The component parts of the patterns of the rod section 3 and the detection heads are entirely the same as those in FIG. 3 but coils 1A$_1$, 1A$_2$, 1C$_1$, 1C$_2$ of the phases A and C and coils 1B$_1$, 1B$_2$, 1D$_1$, 1D$_2$ of the phases B and D which constitute the first detection head 1 are spaced from each other and a second detection head 2 is disposed therebetween. By disposing the detection heads in this manner, crosstalking between the coils of the phases A and C and the coils of the phases B and D can be prevented and besides the entire space for providing the heads 1 and 2 can be reduced.

Figure 18:
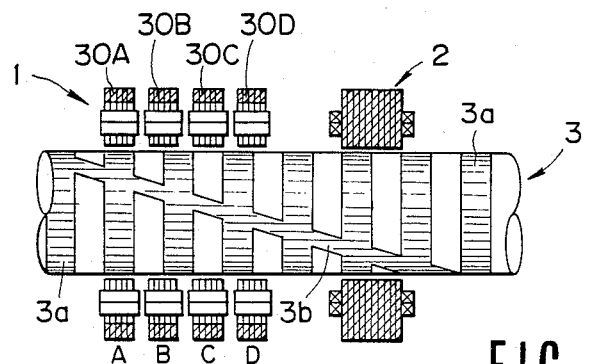
FIG. 18 is a vertical sectional view of another example of the first detection head.
Figure 19:
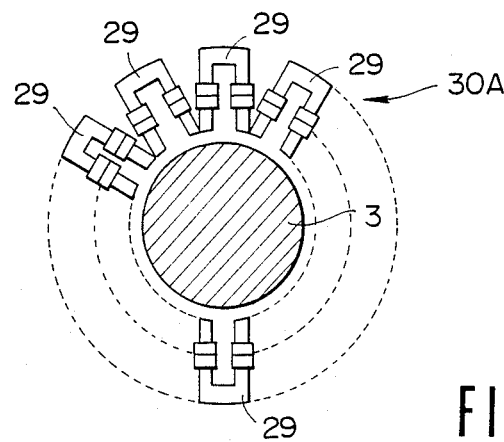
FIG. 19 is a front view of the first detection head shown in FIG. 18.

The first detection head 1 for detecting the first pattern consisting of the repeatedly arranged rings 3a as shown in FIG. 2 may be modified as shown in FIGS. 18 and 19. In FIG. 19, a plurality of cores 29 producing flux in the radial direction of the rod section 3 are arranged side by side and close to each other in the circumferential direction to form a head 30A for one phase and these heads for a necessary number of phases, e.g., 30A through 30D, are provided with a predetermined interval therebetween in the axial direction as shown in FIG. 16. The cores 29 are U-shaped cores having two ends in the same manner as the cores 5 through 8 shown in FIG. 11 and primary and secondary coils are wound about these cores 29. The cores 29 of the same phase are excited by the same AC signal (e.g., the head 30A of the phase A is excited by a sine signal sin ωt) and a signal induced in the secondary coil is added and combined therewith. By this arrangement, while the direction of the flux produced by the respective cores 29 of the first head 1 shown in FIGS. 18 and 19 is the radial direction of the rod section 3 as in the second head 2, this head 1 performs substantially the same operation as the first head 1 shown in FIG. 1 consisting of the coils which produce flux in the axial direction of the rod section 3. More specifically, the head 1 which is constructed by arranging the cores 29 of the same phase side by side and close to each other in the circumferential direction performs the detection operation in a position in which it is disposed covering the entire range in the lateral direction of the rod section 3. In other words, in the position in which the head is disposed, the flux produced by the head extends over the entire circumference of the rod section 3 so that the head performs substantially the same operation as the first head 1 shown in FIG. 1.

Figure 20:
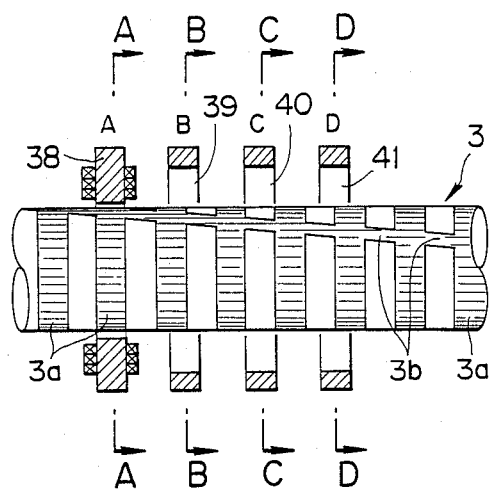
FIG. 20 is a vertical sectional view of an embodiment in which the first and second patterns are detected using a common detection head.
Figure 21A:
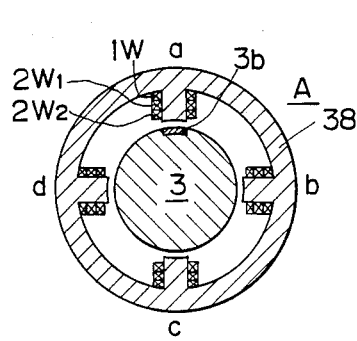
FIGS. 21a through 21d are cross sectional views of heads for respective phases constituting the detection head of FIG. 20 taken along lines A—A, B—B, C—C and D—D in FIG. 20.
Figure 21B:
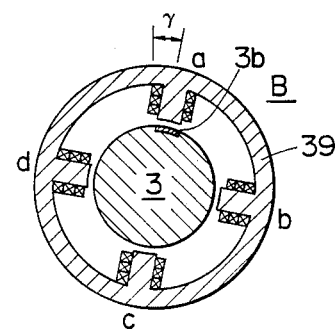
Figure 21C:
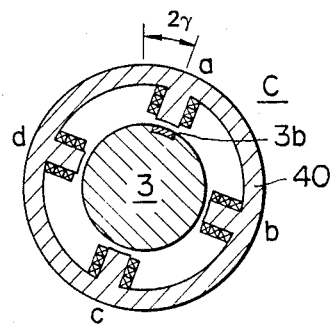
Figure 21D:
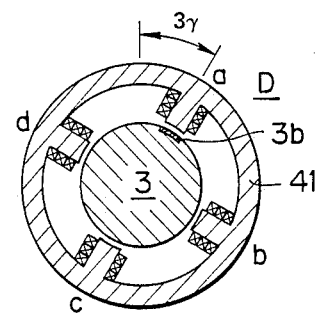
Figure 22:
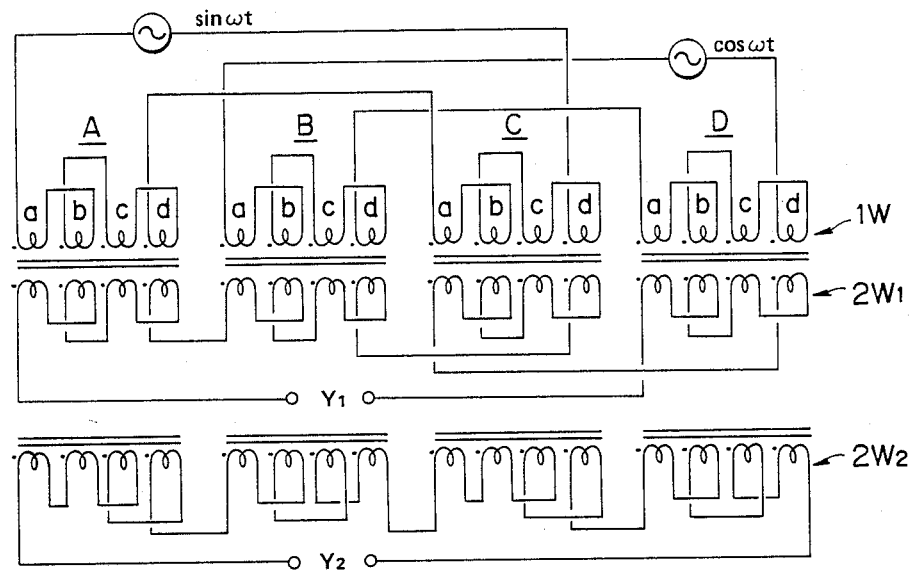
FIG. 22 is a circuit diagram showing connections of the primary and secondary coils for poles of respective phases shown in FIG. 21.

In the above described embodiments, plural detection heads are provided in correspondence to the respective pattern. Alternatively, a common detection head may be provided for all of the patterns. FIGS. 20 through 22 show an example of such common detection head. In this example, the patterns provided on the rod section 3 are the same as those shown in FIG. 2. The detection head functions as a single detection head by combination of heads 38 through 41 corresponding to the respective phases A through D disposed with an interval of P (n±¼) in the longitudinal direction of the rod section 3. Sections in the radial direction of the heads 38 through 41 of the respective phases are shown in FIGS. 21(a) through 21(d) as sectional views along lines A—A, B—B, C—C and D—D in FIG. 20. As will be apparent from the figures, the heads 38 through 41 of the respective phases are of the same construction, each having a magnetic core with four poles (distinguished from one another by reference characters a, b, c and d) disposed with an interval of 90 degrees and one primary coil 1W and two secondary coils 2W1, 2W2 being wound about each of these poles. However, the heads 38 through 41 of the respective phases A through D are provided in such a manner that corresponding ones of the poles a, b, c and d of the respective heads are disposed in sequentially skewed positions by a predetermined angle γ which corresponds to a ratio between the lead L of the spiral pattern 3b on the rod section 3 and the interval P (n±¼) between adjacent ones of the heads 38 through 41. If, for example, there is relation P(n 35 ¼)=k, the angle γ is γ=360×K/L (degrees).

Due to the above described construction, the respective poles a through d of head 38 of the phase A show reluctance change in the same phase with respect to the first pattern consisting of the repeatedly provided rings 3a, the respective poles a through d of the head 39 of the phase B also show reluctance change in the same phase with respect to the first pattern and so do the head 40 of the phase C and the head 41 of the phase D. The phases of the reluctance change of the respective phases A through D shown with respect to the first pattern are different by one pitch length P, i.e., 90 degrees when one cycle is 360 degrees in the same manner as the previously described first detection head 1. If the phase of the reluctance change with respect to displacement x whithin one pitch length P of the first pattern is represented by $\phi$, the reluctance can be changed according to the displacement x with such function characteristics that the phase A shows cos $\phi$, the phase B sin $\phi$, the phase C - cos $\phi$ and the phase D - sin $\phi$.

As to the second pattern consisting of the spiral strip 3b, the poles a show reluctance change of the same phase in all phases A through D, the poles b also show reluctance change of the same phase in all phases A through D and so do the poles c and the poles d. The phases of the reluctance change of the respective poles a through d shown with respect to the second pattern are different by 90 degrees when one pitch length L, i.e., one cycle is 360 degrees in the same manner as the second head 2 shown in FIG. 4. If the phase of the reluctance change with respect to the displacement x within one pitch length L of the second pattern is represented by $\alpha$, the reluctance can be changed according to the displacement x with such function characteristics that the pole a is cos $\alpha$, the pole b sin $\alpha$, the pole c - cos $\alpha$ and the pole d - sin $\alpha$.

When detection is made by the phase system, the primary coils 1W of the respective phases A through D and the respective poles a through d are excited by two reference signals sin wt and cos $\omega$t using the connection as shown in FIG. 22. That is, the poles a and c of the phases A and C are excited by sin $\int$t and the poles b and d of the phases A and C are excited by - sin $\omega$t. The poles a and c of the phases B and D are excited by cos $\omega$t and the poles b and d of the phases B and D are excited by - cos $\omega$t. In response to this excitation, voltages affected by both the first pattern and the second pattern are induced in secondary coils of the poles a through d of the phases A through D. If secondary output voltages of the respective poles of the respective phases are represented by Aa through Dd, these voltages can be expressed by the following equations. In these equations, coefficients are omitted. The first capital letters represent the phases and the second small letters represent the poles. For example, Aa represents a secondary output voltage from the pole a of the head 38 of the phase A. The heads shown in FIGS. 20 and 21 have two secondary coils 2W1 and 2W2 on each pole but output voltages of these coils are the same.

$$
\begin{aligned}
Aa &= \sin\omega t \cos\phi + \sin\omega t \cos\alpha \} \\
Ab &= -\sin\omega t \cos\phi - \sin\omega t \sin\alpha \\
Ac &= \sin\omega t \cos\phi - \sin\omega t \cos\alpha \\
Ad &= -\sin\omega t \cos\phi + \sin\omega t \sin\alpha \\
Ba &= \cos\omega t \sin\phi + \cos\omega t \cos\alpha \\
Bb &= -\cos\omega t \sin\phi - \cos\omega t \sin\alpha \\
Bc &= \cos\omega t \sin\phi - \cos\omega t \cos\alpha \\
Bd &= -\cos\omega t \sin\phi + \cos\omega t \sin\alpha \\
Ca &= -\sin\omega t \cos\phi + \sin\omega t \cos\alpha \\
Cb &= \sin\omega t \cos\phi - \sin\omega t \sin\alpha \\
Cc &= -\sin\omega t \cos\phi - \sin\omega t \cos\alpha \\
Cd &= \sin\omega t \cos\phi + \sin\omega t \sin\alpha \\
Da &= -\cos\omega t \sin\phi + \cos\omega t \cos\alpha \\
Db &= \cos\omega t \sin\phi - \cos\omega t \sin\alpha \\
Dc &= -\cos\omega t \sin\phi - \cos\omega t \cos\alpha \\
Dd &= \cos\omega t \sin\phi + \cos\omega t \sin\alpha
\end{aligned}
\quad (3)
$$

In the right member of the above equations, the first term represents the induced voltage in response to the first pattern and the second term represents the induced voltage in response to the second pattern.

For obtaining the output signal Y1 responsive only to the first pattern, the respective output signals Aa through Dd may be added or subtracted in the following manner:

$$Y1 = Aa - Ab + Ac - Ad + Ba - Bb - Bc - Bd - \quad (4)$$
$$(Ca - Cb + Cc - Cd) - (Da - Db + Dc - Dd)$$

By doing so, the values of the first term of the right member in the equation (3) are added together between the same phases and the values of the second term thereof are cancelled between the same poles with a result that the equation becomes $$Y1 = 8 \sin \omega t \cos \phi + 8\cos \omega t \sin \phi$$
$$\approx K \sin (\omega t + \phi)$$

so that, as in the above described equation (1), an output signal derived by phase-shifting the reference AC signal $\sin \omega t$ by electric phase angle $\phi$ corresponding to the displacement x is obtained.

For obtaining the output signal Y2 responsive only to the second pattern, the respective output signals Aa through Dd may be added or subtracted as follows:

$$Y2 = Aa + Ab - Ac - Ad + Ba - Bb - Bc + Bd + \quad (5)$$
$$Ca + Cb - Cc - Cd + Da - Db - Dc + Dd$$

By doing so, the values of the first term of the right member are all cancelled with a result that the value of the second term only is left and the equation becomes $$Y2 = 4 \sin \omega t \cos\alpha - 4 \sin \omega t \sin\alpha +$$
$$4 \cos \omega t \cos\alpha + 4 \cos \omega t \sin\alpha$$
$$= 4 \sin (\omega t + \alpha) + 4 \cos (\omega t + \alpha)$$
$$\approx K \sin (\omega t + \alpha + 45°)$$

so that, as in the above described equation (2), an output signal derived by phase-shifting the reference AC signal $\sin (\omega t + 45°)$ by electrical phase angle o corresponding to the displacement x is obtained.

FIG. 22 is a connection diagram in which one coil 2W₁ in the two secondary coils wound about each pole of each phase is connected in the manner of the above equation (4) to provide the output signal Y1 (for the vernier) responsive to the first pattern and the other secondary coil 2W₂ is connected in the manner of the above equation (5) to provide the output signal Y2 (for the main scale) responsive to the second pattern.

Figure 23:
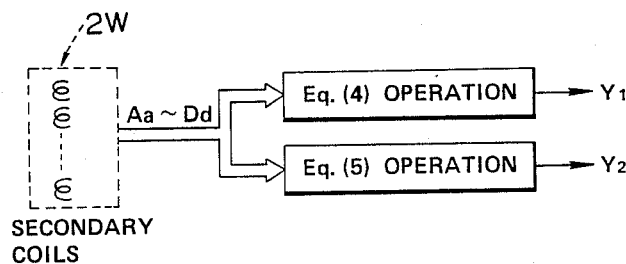
FIG. 23 is a block diagram showing an example of a circuit in which the number of the secondary coil for each pole of each phase in the embodiment of FIGS. 20 and 21 is reduced to one and output signals corresponding to the first and second patterns are respectively obtained by operating output signals of the secondary coils of the respective poles.

As will be apparent to those skilled in the art, the algebraical operation processings of the equations (4) and (5) may be performed in an analog fashion instead of connecting the secondary coils as shown in FIG. 22. In that case, only one secondary coil may be wound about each of the poles a through d of the respective heads 38 through 41. As shown in FIG. 23, the secondary output voltages Aa through Dd of the respective poles of the respective phases as shown in the above equation (3) are separately derived from the secondary coil group 2W and these voltages are supllied to an operation circuit 42 in which the operation of the equation (4) is performed for providing the output signal Y1 responsive only to the first pattern while these voltages are supplied to an operation circuit 43 in which the operation of the equation (5) is performed for providing the output signal Y2 responsive only to the second pattern.

In the above described embodiments, the position detection data is obtained according to the phase system. Alternatively, position detection data having a voltage level corresponding to the position may be obtained in accordance with a voltage system as is well known by a conventional differential transformer. In that case, the provision of the phase difference in the AC signals for exciting the primary coils is unnecessary. Further, an arrangement may be made so that the position detection data Dx1 which requires a high degree of accuracy is obtained by the phase system and the other position detection data is obtained by the voltage system. In the case where the first pattern and the second pattern are both detected by using a common detection head, a phase component and a voltage component may be separated from the output signal of the single detection head and the position detection data Dx1 of a high resolution used for the vernier may be obtained by the voltage system and the position detection data used for the main scale may be obtained by the voltage system.

Taking some examples, the manner of forming the patterns on the rod section 3 will now be described. Material of a good conductor or magnetic substance for constituting the patterns 3a, 3b, 3b₁ and 3b₂ may be deposited or formed on the rod section 3 by utilizing a suitable surface treatment technique (such as electroplating, flame spraying, baking, coating, solvent welding, vapor deposition, electroforming and photoetching). There have recently been destablished microprocessing techniques according to which the minutest pattern can be formed by utilizing the above mentioned surface treatment techniques so that a precise pattern can be formed by employing such techniques.

Figures 24, 25:
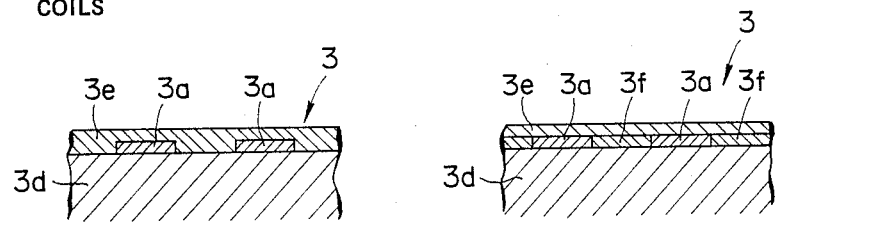
FIGS. 24 through 28 are sectional views respectively showing specific examples of manners of forming patterns on a member on which the patterns are to be disposed.

FIG. 24 shows an example in which a base member 3d of the rod section 3 is formed thereabout with the patterns 3a and 3b made of a good conductor such as copper and is provided thereon with a surface coating 3e by means of, e.g., plating with chromium. For forming the patterns, the base member 3d is plated on its entire circumferential surface with copper and thereafter an unnecessary portion is removed by a removing technique such as etching to form the desired patterns 3a and 3b with the remaining plated portion. Lastly, the surface coating 3e such as plating with chromium is applied for finishing the surface. Magnetic substance such as iron is a suitable material for the base member 3d because it facilitates passing of flux therethrough. Resins such as plastics and other materials may also be used as the base member 3d. In the case where plastic is used, the surface of the preformed plastic base member 3d may be plated with metal, e.g., copper, or a metal film such as a copper film may be preformed on a metal cavity by means of electroforming and thereafter plastic may be injection molded to be integrated with the metal film.

If the surface coating is made in such a manner that the recesses between the patterns 3a are filled with the surface coating 3e as shown in FIG. 24, the coating 3e tends to sink with resulting difficulty in obtaining a smooth surface finishing. Therefore, as shown in FIG. 25, the recesses between the patterns 3a are preferably filled with suitable pads 3f and the surface coating 3e is applied thereon. The pads 3f may be formed by, e.g., plating with nickel.

In the case where the base member 3d is plated with a metal such as copper and thereafter etching is applied in a desired pattern, there is a likelihood that the surface of the base member 3d is corroded by the etching used. Particularly so if the base member 3d is made of a metal such as iron. For overcoming this problem, as shown in FIG. 26, a thin film of a predetemined material 3g (e.g., resin) which exhibits strong resistivity to the etching agent is preferably formed on the entire surface of the base member 3d, plating with copper is applied thereon and thereafter etching is applied to form the patterns 3a.

In forming the first pattern and the second pattern in a mixed state on the rod section 3, a composite pattern of the two patterns may be formed at once or, alternatively, one pattern may be formed first and the other pattern may be formed thereon in an overlapping fashion.

The material constituting the patterns is not limited to a good conductor such as copper or aluminum or a mixture or a compound thereof which produces reluctance change by the eddy current loss but may be magnetic substance (e.g., iron or a compound or mixture thereof) which produces reluctance change due to the change in permeability. In the case where the patterns are formed with such magnetic substance, the patterns can be formed by selectively employing the various surface treatment techniques described above.

Figures 26, 27, 28:
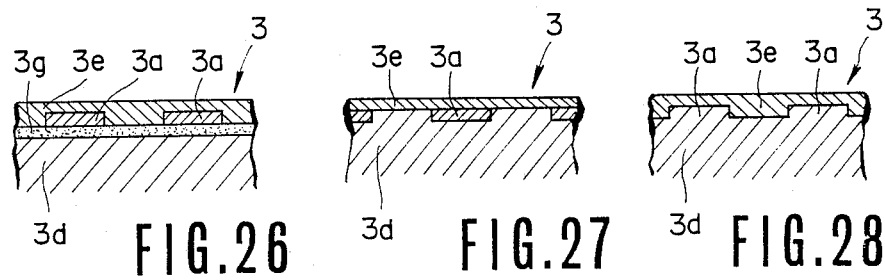

As shown in FIG. 27, a desired pattern may be formed by constituting the base member 3d of the rod section 3 of magnetic substance such as iron, forming recesses corresponding to the desired pattern on the base member 3d by machining it and filling these recesses with a good conductor 3a. In this case, the projecting portions of the base member 3d consisting of magnetic substance enter the intervals between the patterns of the good conductors 3a and, in these portions, reluctance change which is small due to relatively small eddy current loss becomes further smaller due to projection of the magnetic substance whereby accuracy in response of the sensor output signal to the displacement of the rod section is improved in a synergistic manner. Further, as shown in FIG. 28, projecting portions 3a corresponding to a desired pattern may be formed by machining on the surface of the base member 3d consisting of magnetic substance of the rod section 3 and these projections 3a may be used as the patterns consisting of magnetic substance. In this case, reluctance change corresponding not to eddy current loss but to permeability change can be produced.

The patterns disposed on a pattern provided member need not be visibly distinguishable but have only to be distinguished from the rest of portion in its magnetic characteristic. For example, by making the base member 3d of the rod section 3 with stainless steel and heating this base member of stainless steel locally by suitable means such as laser beam in accordance with a desired pattern, the heated portion is converted to magnetic substance. Thus, the portion of the pattern can be made a magnetic substance portion while the rest of portion remains a non-magnetic substance portion notwithstanding that the pattern and the base member are both made of stainless steel.

The manner of forming the patterns which has been described with reference to FIGS. 24 through 28 is applicable not only to the embodiments shown in FIGS. 1 through 23 but also to embodiments to be described below, that is, to all cases in which the patterns are to be formed on a member provided with the patterns according to the present invention.

In the above embodiments, patterns of different forms are provided in a mixed state on a common region on the rod section, i.e., the pattern provided member. The invention however is applicable not only to these but also to a case where two (or more) patterns of the same form are disposed along different channels on the pattern provided member or to a case where different patterns are disposed along different channels on the pattern provided member. The term "channel" herein means a region provided with a pattern extending in the longitudinal direction of the pattern provided member, i.e., the rod section.

Figures 29, 30:
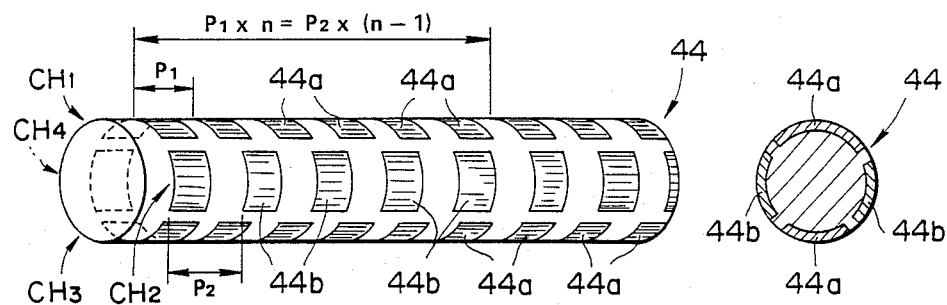
FIG. 29 is a perspective view showing an embodiment in which two or more patterns of different pitches are disposed in different channels on a rod section.
FIG. 30 is a cross sectional view of the rod section in FIG. 29.

FIGS. 29 and 30 show an example of such embodiment. The cylindrical side surface of a rod section 44 is divided into four channels in which two opposed channels CH1 and CH3 are provided with the first pattern of the same form and other opposed two channels CH2 and CH4 are provided with the second pattern of the same form. The first pattern is formed by repeatedly disposing rectangular patterns 44a at equal interval with one pitch length P1. The second pattern is formed by repeatedly disposing rectangular patterns 44b at equal interval with one pitch length P2. The pitch lengths P1 and P2 are slightly different from each other in that when the pattern of P1 is repeated n times, the pattern of P2 is repeated n−1 times, i.e., $P1 \times n = P2 \times (n-1)$. An absolute position can be detected within the range of $P1 \times n$.

Figure 31:
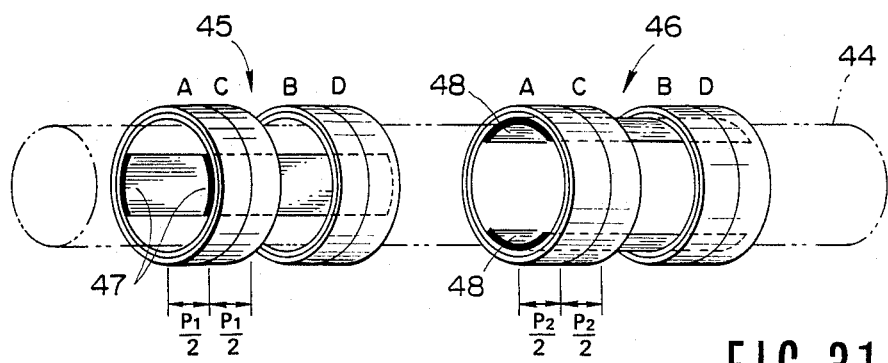
FIG. 31 is a perspective view of one example of the detection head applied to the rod section of FIG. 29.

An example of the detection head used for this rod section 44 is shown in FIG. 31. As in the first detection head 1 in FIG. 1, a first detection head 45 corresponding to the first pattern 44a and a second detection head 46 corresponding to the second pattern 44b both consist of primary and secondary coils of four phases A through D with the rod section 44 being inserted through a space defined in the coils. The coil length of the first head 45 for one phase is P1/2 and the coil length of the second head 46 for one phase is P2/2. Positional relation between the coils of the phases A through D is the same as the one shown in FIG. 1.

In the first detection head 45, a masking 47 is provided inside the coil in a position corresponding to the second pattern 44b. This head 45 responds only to the first pattern 44a and does not respond to the second pattern 44b. In the second detection head 46 also, a masking 48 is provided inside the coil in a position corresponding to the first pattern 44a. This head 46 responds only to the second pattern 44b and does not respond to the first pattern 44a. The maskings 47 and 48 consist of material which acts on the flux in a similar manner to the material constituting the patterns 44a and 44b. The maskings 47 and 48 are preferably made of the same material as the patterns 44a and 44b but need not be the entirely same material. The maskings 47 and 48 function to prevent the detection heads 45 and 46 from reacting to the periodical change of the patterns 44b and 44a in the masked portions and thereby substantially prevents induction of voltage in response to the change in the patterns.

Figure 32:
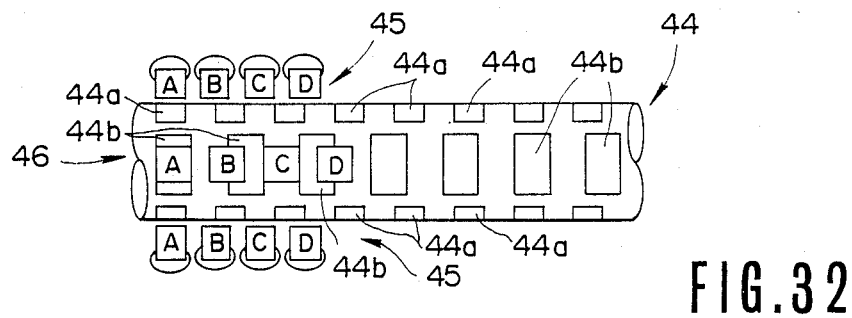
FIG. 32 is a sectional side view showing another example of the detection head applied to the rod section of FIG. 29.

Another example of detection heads applicable to the rod section 44 is shown in FIG. 32. In these detection heads, a pole consisting of a U-shaped magnetic substance core and primary and secondary coils wound about it is provided for the respective phases A through D so that flux will be formed in the radial direction of the rod section 44. The first detection head 45 is provided in correspondence to the arrangement of the first pattern 44a and the second detection head 46 to the second pattern 44b.

Figure 33:
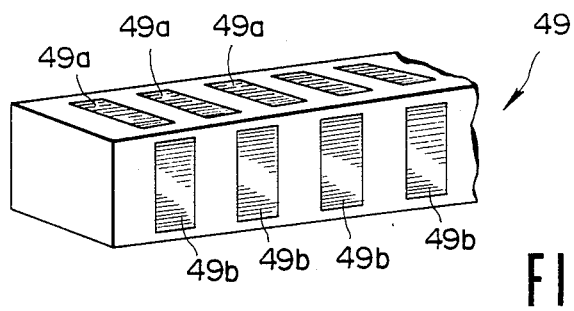
FIG. 33 is a perspective view showing an example of a rod section of a square cross section having a pattern arrangement similar to the one shown in FIG. 29.
Figure 34:
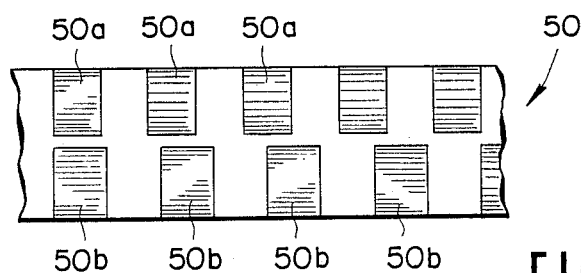
FIG. 34 is a plan view showing an example of a flat bar member having a pattern arrangement similar to the one shown in FIG. 29.

The arrangement of the pattern as shown in FIG. 29 can of course be carried out in a square rod 49 as in FIG. 33. Reference character 49a represents the pattern of the pitch P1 and reference character 49b represents the pattern of the pitch P2. On a flat bar member 50, patterns 50a and 50b of different pitches as shown in FIG. 34 may be disposed along different channels. For the detection heads 45 and 46, the same ones shown in FIG. 32 may be used.

In the embodiments of FIGS. 29, 33 and 34, patterns of the same form and different repeating pitches are disposed along separate channels. However, patterns of different forms as shown in FIGS. 1 through 20 may of course be disposed in separate channels as in FIGS. 29, 33 and 34.

Figure 35:
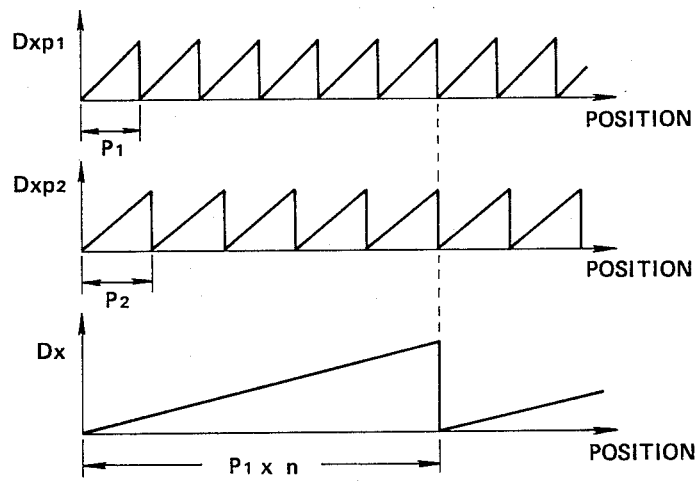
FIG. 35 is a graph showing an example of position detection data obtained in response to the first and second patterns of slightly different pitches as shown in FIGS. 29 through 34 and also an example of absolute position data in an expanded range obtained by processing the position detection data.

In the case where two (or more) patterns whose pitches of repetition are slightly different from each other as shown in FIG. 29 are employed and position detection data Dxp1 and Dxp2 are obtained by the phase system or the voltage system as described above, changes in the respective values become as shown in FIG. 35. For obtaining absolute position data Dx of an expanded range from these data Dxp1 and Dxp2, the above described principle of vernier and main scale is not employed but the operation processing described in Japanese Preliminary Patent Publication No. 79114/1984 is employed. Detailed description of the latter operation is omitted but, briefly, taking into account that there is correlation, due to the difference between the pitch lengths P1 and P2 of the two patterns, between values of position detection data Dxp1 (changing cyclically with one pitch length P1 constituting one cycle) and position detection data Dxp2 (changing cyclically with one pitch length P2 constituting one cycle) corresponding to the respective patterns in the range within which detection of an absolute position is possible (i.e., range of $P1 \times n = P2 \times (n-1)$ in FIG. 29) and the number of cycles of these values from the origin to the present position, a predetermined operation is performed. By combination of the number of cycles (the number of pitches) of one of the patterns corresponding to the present position thus obtained and the position detection data Dxp1 or Dxp2, the absolute position data Dx within an expanded range can be obtained. In this manner, the present position is determined by the absolute value which is of a high accuracy and besides the range within which detection can be made in the absolute value is a range $P1 \times n$ or $P2 \times (n-1)$ which is greatly expanded from one pitch length P1 or P2.

In the above described embodiments, the primary coils and secondary coils for the respective phases in the detection heads need not be separate coils but may be common ones as those described in Japanese Preliminary Utility Model Publication No. 2621/1983 or No. 39507/1983.

The rod section on which the patterns are disposed and other members may be a part of a machine or equipment which is the object of detection. If, for example, the present invention is applied to a device for detecting a position of a piston rod for a hydraulic cylinder, the piston rod is utilized as the pattern provided member of the present invention. For another example, a guide bar for guiding a displacing member in a machine may be utilized as the pattern provided member of the present invention and a detection head which is interlocked with the displacing member may be displaced along the guide bar (i.e., the pattern provided member).

As described in the foregoing, according to the invention, two or more types of patterns are provided on a rod or other pattern provided member and a position detection signal corresponding to a positional relation of a detection head with respect to the pattern provided member is obtained for each of these patterns. As a result, the necessity for providing the pattern provided member separately for each pattern has been obviated and detection of an absolute position with high accuracy and over a wide range can be realized with a very simple construction.

I claim:

1. Absolute position detection device comprising:
    a member having a first pattern which repeats change in the longitudinal direction of the member with a predetermined pitch and a second pattern which changes in the longitudinal direction of the member with a pitch which is different at least from that of the first pattern, these patterns being formed of a predetermined material and disposed on the member; and
    a detection head section provided in proximity to this member and responding individually to the first pattern and the second pattern on said member, said detection head section changing its relation of correspondence to the respective patterns in accordance with its linear position with respect to said member and producing output signals in accordance with the relation of correspondence to the respective patterns;
    wherein said second pattern consists of a pattern which is of a different form from said first pattern; and wherein said first and second patterns are disposed in a mixed state in a common region on said member.

2. Absolute position detection device comprising:
a member having a first pattern which repeats change in the longitudinal direction of the member with a predetermined pitch and a second pattern which changes in the longitudinal direction of the member with a pitch which is longer than that of the first pattern and in a form which is different from that of the first pattern, these patterns being formed of a predetermined material and disposed on the member;
a detection head section provided in proximity to this member and responding individually to the first pattern and the second pattern on said member, said detection head section changing its relation of correspondence to the respective patterns in accordance with its linear position with respect to said member and producing first and second output signals representing electrical phase change whose one cycle is constituted of one pitch of the respective patterns; and
means for obtaining first absolute position data whose one cycle is constituted of one pitch of the first pattern by measuring electrical phase difference of the first output signal from a predetermined reference AC signal and obtaining second absolute position data whose one cycle is constituted of one pitch of the second pattern by measuring electrical phase difference of the second output signal from the reference AC signal and thereby providing, responsive to said first and second absolute position data, data specifying absolute linear position of said detection head with respect to said member.

3. Absolute position detection device defined in claim 2 wherein said predetermined material constituting said patterns is a relatively better conductor than material constituting other portion of said member.

4. Absolute position detection device as define in claim 2 wherein said predetermined material constituting said patterns is magnetic substance.

5. Absolute position detection device as defined in claim 2 wherein said member consists of a rod and said first pattern consists of annular patterns having a predetermined width with an interval equivalent to said width and provided repeatedly about said rod, and said second pattern consists of a pattern spirally formed about said rod.

6. Absolute detection device as defined in claim 2 wherein said first pattern consists of parallel patterns each having a predetermined width and being provided repeatedly with a predetermined interval in the longitudinal direction of said member and said second pattern consists of a pattern which changes obliquely in the longitudinal direction of said member.

7. Absolute position detection device as defined in claim 2 wherein said detection head section comprises a plurality of detection heads individually producing output signals in correspondence to said respective patterns.

8. Absolute position detection device as defined in claim 2 wherein said detection head section comprises a first detection head which detects a pattern, in a position in which it is disposed, covering entire region in the lateral direction of a surface on which said pattern are disposed and a second detection head which detects a pattern, in a position in which it is disposed, covering a part of region in the lateral direction of a surface on which said patterns are disposed, said first detection head producing an output signal responding to one of said first and second patterns and said second detection head producing an output signal responding to the other of said patterns.

9. Absolute position detection device as defined in claim 8 wherein said first and second patterns change in forms suitable for the regions covered by said detection heads corresponding to the respective patterns.

10. Absolute position detection device as defined in claim 2 wherein each detection head in said detection head section comprises means for generating flux and means for detecting magnetism.

11. Absolute position detection device as defined in claim 10 wherein said detection head section comprises a first detection head and a second detection head which form flux with respect to said member in different directions from each other.

12. Absolute position detection device as defined in claim 11 wherein one of said first and second detection heads forms flux mainly in a parallel direction to the surface on which said patterns are disposed on said member and the other of said detection heads forms flux mainly in a vertical direction of the surface on which said patterns are disposed.

13. Absolute position detection device as defined in claim 10 wherein said detection head section comprises a first detection head and a second detection head and one of said detection heads forms flux, in a position in which it is disposed, covering entire region in the lateral direction of a surface on which said patterns are disposed on said member and the other of said detection heads forms flux, in a position in which it is disposed, covering a part of surface on which said patterns are disposed on said member.

14. An absolute position detection device comprising:
an elongated member having a first pattern repeating in the longitudinal direction of the member with a predetermined pitch and a second pattern which repeats in the longitudinal direction of the member with a pitch which is different from that of the first pattern, the patterns being formed of a predetermined material and disposed on the circumference of the member, with one pattern superimposed on the other in a common region of the member; and
a detection head section provided in proximity to the elongated member and responding individually to the first pattern and the second pattern of said member, said detection head section changing its relative position to the first and second patterns in accordance with its linear position with respect to the member and producing first and second output signals representing electrical phase change where the cycle of each output signal is constituted of one pitch of the respective patterns.

15. An absolute position detection device as defined in claim 14 wherein the length of one pitch of the first pattern is longer than the length of one pitch of the second pattern.

16. An absolute position detection device comprising:

a first detection head and a second detection head, the first detection head generating magnetic flux axially and producing a first output signal, the second detection head generating magnetic flux radially and producing a second output signal;

an elongate member having a first pattern that changes longitudinally along the elongated member and a second pattern that changes radially and extends longitudinally along the circumference of the elongated member; and means for obtaining first absolute position data corresponding to the position of the first detection head relative to the elongated member by measuring the electrical phase difference of the first output signal from a predetermined reference AC signal and for obtaining second absolute position data corresponding to the position of the second detection head relative to the second pattern by measuring the electrical phase difference of the second output signal from a predetermined reference AC signal.

17. An absolute position detection device as defined in claim 16 wherein one of the patterns is superimposed on the other pattern in a common region of the member.

18. An absolute position detection device as defined in claim 16 wherein the length of one pitch of the first pattern is longer than the length of one pitch of the second pattern.

* * * * *